United States Patent [19]

Hiramoto

[11] Patent Number: 4,578,144
[45] Date of Patent: Mar. 25, 1986

[54] METHOD FOR FORMING A SINGLE CRYSTAL SILICON LAYER

[75] Inventor: Tatsumi Hiramoto, Machida, Japan

[73] Assignee: Ushio Denki Kabushiki Kaisha, Tokyo, Japan

[21] Appl. No.: 526,456

[22] Filed: Aug. 25, 1983

[51] Int. Cl.$^4$ .............................................. C30B 1/08
[52] U.S. Cl. ................................................ 156/617 R
[58] Field of Search ................... 156/617 R, DIG. 88, 156/DIG. 73, 620, 622, 616 R; 427/53.1, 55; 250/494, 495

[56] References Cited

U.S. PATENT DOCUMENTS

| | | | |
|---|---|---|---|
| 2,933,384 | 4/1960 | Walker et al. | 156/617 R |
| 3,630,684 | 12/1971 | Keller | 156/620 |
| 4,081,313 | 3/1978 | McNeilly et al. | 156/612 |

FOREIGN PATENT DOCUMENTS

| | | | |
|---|---|---|---|
| 0021829 | 2/1983 | Japan | 156/DIG. 73 |
| 8303851 | 11/1983 | PCT Int'l Appl. | 156/DIG. 88 |

Primary Examiner—Hiram H. Bernstein
Attorney, Agent, or Firm—Ziems, Walter & Shannon

[57] ABSTRACT

Disclosed herein is a process for forming a singlecrystalline silicon layer by heating a wafer having a starting silicon layer of amorphous or polycrystalline silicon on the singlecrystalline silicon substrate, in accordance with the epitaxial growth technique. The process comprises providing a heat source comprising a plurality of tubular lamps provided in a parallel second plane above a first plane in which the wafer is placed; lighting the tubular lamps to radiate their light to the wafer so as to hold the starting silicon layer at 1100°-1400° C. for 4 seconds or longer; and then, radiating light from a specific lamp to a portion of the starting silicon layer of the wafer where the temperature of the portion of the starting silicon layer is raised to 1410°-1480° C. and to form a narrow molten region and forming the same narrow molten regions successively one after another in the wafer. The above process can convert the starting silicon layer to a singlecrystalline silicon layer in a relatively short period of time and without danger of damaging the wafer.

9 Claims, 5 Drawing Figures

METHOD FOR FORMING A SINGLE CRYSTAL SILICON LAYER

BACKGROUND OF THE INVENTION

1. Field of the Invention

This invention relates to a process for forming a single crystal silicon layer on a single crystal silicon substrate in accordance with the epitaxial growth technique.

2. Description of the Prior Art

As a process for forming a single crystal silicon layer on a single crystal silicon substrate by making use of the epitaxial growth technique for fabrication of a semiconductor device, it has been known to form a starting silicon layer made of amorphous silicon (hereinafter called "a-silicon") or polycrystalline silicon on a single crystal silicon substrate and then to heat the starting silicon layer so as to allow the starting silicon layer to regrow into a single crystal layer having the same crystal plane as the single crystal of the substrate. For example, it has been known to heat a wafer, in which an a-silicon layer of for example 4000 Å thick is formed on a surface of a single crystal silicon substrate, for example at about 600° C. and approximately for 80 minutes in a resistance furnace so that the a-silicon layer is converted into a single crystal layer. The above process however requires to continue the heating over a relatively long period of time and is thus impractical from the viewpoint of productivity. It may be possible to increase the growth speed of each single crystal by raising the heating temperature in the above process. However, use of a high heating temperature in the above process is accompanied by such drawbacks that wafers tend to develop "warpage" or "contamination" and the production yield hence becomes poor.

On the other hand, it has recently been studied to develop a process for forming a single crystal layer by directing a laser beam for a short period of time onto a starting silicon layer formed on a single crystal silicon layer to melt the starting silicon layer and then solidifying the thus-molten silicon layer in accordance with the epitaxial growth technique. Reference may for example be made to U.S. Pat. No. 4,309,225. In the above process which makes use of a laser beam, an a-silicon layer is scanned by the small spot light of the laser beam. It has been pointed out, as a shortcoming of the above process, that the laser beam develops certain excessively-heated portions in the boundary region between each scanning line, along which the small spot light of the beam passes, and its adjacent scanning line and disturbs the crystalline texture there, thereby resulting in formation of grain boundaries; or the above process requires too much time if the interval of the scanning lines is shortened. Therefore, this laser beam process is difficult to form single crystal silicon layers which make up SOI (Silicon on Insulator) structures useful for fabrication of layered three-dimensional IC devices which are considered to incorporate "the latest IC system".

SUMMARY OF THE INVENTION

An object of this invention is to provide a novel process for forming a single crystal silicon layer by heating an a-silicon or polycrystalline silicon layer on a single crystal silicon substrate in accordance with the epitaxial growth technique so that the a-silicon layer or polycrystalline silicon layer may be converted in its entirety into the single crystal silicon layer owing to an epitaxial growth in a relatively short period of time without damaging the wafer.

Another object of this invention is to provide a process which facilitates fabrication of a single crystal silicon layer making up an SOI structure.

In one aspect of this invention, there is thus provided a process for forming a single crystal silicon layer by heating a wafer, which is made of a single crystal silicon substrate and a starting silicon layer made of amorphous or polycrystalline silicon and provided on the silicon substrate, in accordance with the epitaxial growth technique, which process comprises the following steps:

providing a heat source which comprises a plurality of tubular lamps provided side by side with their longitudinal axes extending substantially in parallel with one another in a second plane lying above and substantially in parallel with a first plane in which the wafer is placed;

lighting the tubular lamps of the heat source to radiate their light to the wafer so that the wafer is heated and the temperature of the starting silicon layer is maintained at 1100°–1400° C. for 4 seconds or longer; and then, radiating light from a specific lamp which is one of the tubular lamps and is lit with an excess input greater than the remaining lamps to a portion of the starting silicon layer of the wafer so as to raise the temperature of the portion of the starting silicon layer to 1410°–1480° C. and to form a narrow molten region and forming the same narrow molten regions as the former narrow molten region successively one after another in the wafer so as to convert the starting silicon layer into the single crystal silicon layer in accordance with the epitaxial growth technique.

The process according to this invention can convert the starting silicon layer in its entirety into a single crystal silicon layer in a relatively short period of time and without danger of damaging the wafer. It also facilitates formation of single crystal silicon layers which make up SOI structures.

The above and other objects, features and advantages of the present invention will become apparent from the following description and the appended claims, taken in conjunction with the accompanying drawings.

DETAILED DESCRIPTION OF THE INVENTION

Figure 1:
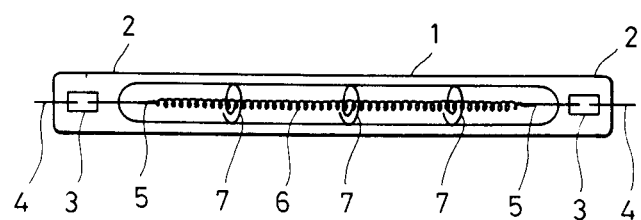
FIG. 1 is a schematic illustration of one example of a tubular lamp useful in the practice of this invention.

The present invention will be described in further detail with reference to the accompanying drawings. FIG. 1 is a schematic illustration of one example of tubular lamps which make up the light source of a below-described heat source useful in the practice of the process according to this invention. The tubular lamp may for example be a halogen incandescent lamp of 1 KW rated power consumption. In FIG. 1, numeral 1 indicates an envelope, which includes sealed portions 2,2 at both ends thereof. Metal foils 3,3 are respectively embedded and sealed in their corresponding sealed portions 2,2. Outer leads 4,4 and inner leads 5,5 extend respectively from their corresponding foils 3,3. Between the inner leads 5,5 is extended a filament 6 of about 16 cm long along the longitudinal axis of the envelope 1. Numeral 7 indicates supports for holding the filament 6 in registration with the longitudinal axis of the envelope 1. The envelope 1 contains a trace amount of a halogen element together with a rare gas. The above lamp is known to have such features as compactness and long service life.

Figure 2:
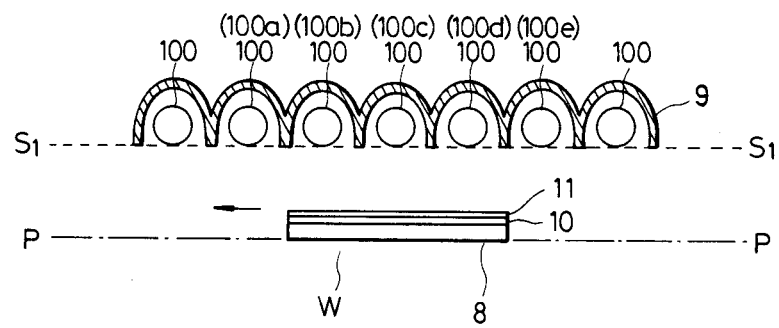
FIG. 2 is a schematic and fragmentary illustration of one example of a heat source useful in the practice of the first and second embodiments of this invention.

Referring now to FIG. 2, a wafer W which has been formed by applying a silicon layer made for example of a-silicon on a substrate 8 of single crystal silicon is placed in a first plane P. A plurality of tubular lamps 100 (7 lamps in the illustrated embodiment), which have the same structures as the tubular lamp depicted in FIG. 1, is arranged side by side above the first plane P in such a manner that the tubular lamps 100 lie in a second plane $S_1$ parallel with the first plane P and the longitudinal axes of the tubular lamps 100 are parallel with one another. A reflector plate 9 covers above these lamps 100. The wafer W is moved along the first plane P and, as indicated by an arrow, in a direction perpendicular to the longitudinal axes of the tubular lamps 100.

Figure 3:
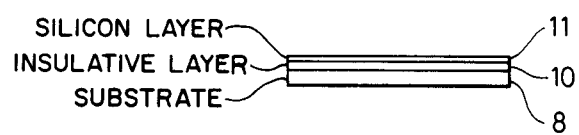
FIG. 3 is a cross-sectional view of a wafer to be processed in accordance with the process of this invention.
Figure 4:
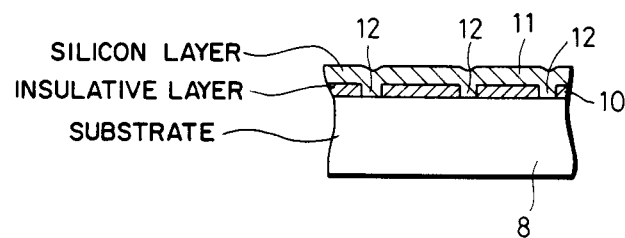
FIG. 4 is an enlarged, fragmentary and cross-sectional view of the wafer of FIG. 3.

FIG. 3 is an enlarged schematic illustration of the wafer W which is provided with a starting silicon layer 11 to be converted into a single crystal silicon layer. The starting silicon layer 11 is made of a-silicon or polycrystalline silicon. The wafer W in the illustrated embodiment has an insulative layer 10 formed of an insulative material such as silicon oxide or silicon nitride on the upper surface of a substrate 8. As illustrated in FIG. 4, cut grooves 12 are formed through the insulative layer 10. The starting silicon layer 11 is formed on the insulative layer 10 and an exposed surface of the substrate 8. Therefore, the starting silicon layer 11 is in direct contact with the substrate 8 at the cut grooves 12.

Dimensions of the wafer W will next be given by way of example. The thickness and diameter of the substrate 8 are respectively about 0.5 mm and about 10 cm. The insulative layer 10 is about 0.2 μm thick. The thickness of the starting silicon layer 11 made of a-silicon is about 1 μm. The width of each of the cut grooves, which are formed with an interval of about 50–500 μm, is 2–3 μm.

In the first embodiment of this invention, the wafer W is placed as illustrated in FIG. 2 in the first plane P in such a manner that the wafer W confronts a central part of an area of arrangement of the tubular lamps 100. All the lamps 100 are then turned on with the rated power. In 3–5 seconds after lighting the lamps 100, the temperature of the starting silicon layer 11 increases uniformly and in its entirety to 1100°–1400° C. The starting silicon layer 11 is then temporarily held, for at least 4 seconds, within the above temperature range. Thereafter, a specific tubular lamp 100a, which is one of the tubular lamps 100, lying in the advancing direction of the wafer W and closest to the wafer W (i.e., the second lamp from the left in the embodiment illustrated in FIG. 2) is lit with a power greater than the rated power, for example, the power of 1.2 KW. While maintaining the above operation state, the wafer W is moved so that every point on the wafer W passes right underneath this lamp 100a.

The starting silicon layer 11 of the wafer W has already been heated to 1100°–1400° C. before it reaches the position right underneath the lamp 100a. The starting silicon layer 11 is thus heated to 1410°–1480° C. at the position right underneath the lamp 100a, where the silicon of the starting silicon layer 11 is melted at a narrow region extending along the lengthwise direction of the lamp 100a and lying right underneath the same lamp 100a. Owing to liquid phase epitaxial growth, the silicon present in the narrow region changes into a single crystal with the same crystal plane as the substrate 8. The narrow molten region moves along the starting silicon layer 11 as the wafer W moves. Namely, the above conversion into a single crystal is effected, similar to the zone-melting-method or zone-refining-method, by heating the starting silicon layer 11 little by little from one narrow region to the next as these narrow regions reach successively the position right underneath the lamp 100a, which is lit with an excess input, owing to the transfer of the wafer W. The starting silicon layer 11 is thus converted in its entirety into a single crystal eventually. Here, it is desirous to use argon gas as the atmosphere in the heat source. The growth of the single crystal silicon is effected using the single crystal silicon of the substrate 8, with latter single crystal silicon the starting silicon layer 11 is in contact through the cut grooves 12 of the insulative layer 10, as seed crystals, so that the conversion of the starting silicon layer 11 into a single crystal silicon layer begins from the latter single crystal silicon. The single crystal grows also on the insulative layer 10 along the layer of the insulative layer 10 (lateral epitaxy).

In the above-mentioned operation, it is necessary to raise the temperature of the starting silicon layer 11 of the wafer W to 1410°–1480° C. (above the melting point of silicon) at the position right underneath the lamp 100a.

If a wafer is heated at the same time and in its entirety at temperatures as high as 1410°–1480° C. for a long period of time, there is a danger that the wafer would be molten or would develop "warpage". According to the process of this invention, it is however possible to convert the starting silicon layer in its entirety into a layer of single crystal coincided in the direction of crystal plane with the substrate by the epitaxial growth technique, without damaging the substrate or developing "warpage". Moreover, the process of this invention does not develop any grain boundaries, thereby ensuring the formation of a layer of single crystal. In order to permit easy control of the heating temperature, the power consumption of the lamps, interval of the lamps, spacing between the lamps and wafer, etc. may be suitably adjusted so as to select with relative ease the heating temperature from the range of 1100°–1480° C.

By holding the starting silicon layer 11 of the wafer W temporarily, i.e., for 4 seconds or longer at 1100°–1400° C., it is possible to avoid the non-uniform growth of a single crystal, which would otherwise occur due to non-uniformity in temperature increase, compared with heating the wafer W in its entirety directly from room temperature to the growing temperature. Accordingly, the above holding period of starting silicon layer 11 at 1100°–1400° C. is effective in avoiding the deformation of the wafer. Accordingly, the process according to this invention may be considered to be a sort of "thermal assist process". The temporary holding time should be at least 4 seconds.

The moving speed of the wafer varies of course depending on the temperature at the position right underneath the lamp 100a, which temperature may range from 1410° C. (equal to the melting point of silicon) to 1480° C. It is generally preferred to cause the wafer to pass at a speed of 0.1 cm/sec. or faster right underneath the lamp 100a. Excessively slow moving speeds may induce such drawbacks that the wafer may be excessively heated at some portions and the resulting molten portions tend to swell up in spherical shapes due to surface tensions, leading to a loss of planarity and non-uniformity in thickness of the resulting single crystal layer. However, excessively fast moving speeds cannot raise the temperature of the wafer to any of the desired temperature levels, leading to insufficient conversion into a single crystal. Thus, the upper limit of the moving speed is about 8 cm/sec. or so.

As a modification to the above-described first embodiment of this invention, the wafer W may be continually moved without any stop through the heat source so long as the above-mentioned requirements that the starting silicon layer 11 of the wafer W is held at 1100°–1400° C. for 4 seconds or longer is satisfied until the forefront of the wafer W reaches the position right underneath the lamp 100a.

In the second embodiment of this invention, a heat source of the structure illustrated in FIG. 2 is used. After holding a wafer for 4 seconds or longer at 1100°–1400° C. similar to the first embodiment, the tubular lamps 100 which are arranged in a region right over the wafer W and all of which have been lit with the rated power are lit successively, one after another in the order as they are arranged, each for a predetermined period of time and with an excess input greater than the rated power while holding the wafer W at the same position. In other words, the tubular lamps 100 are successively turned on with an excess input greater than input for other lamps in the order as they are arranged. This will be descirbed further with reference to the embodiment shown in FIG. 2. Marking the four tubular lamps 100 arranged side by side at the right side of the lamp 100a as 100b, 100c, 100d and 100e respectively, these tubular lamps are successively fed with the excess input and thus lit in the same order. This permits the narrow molten region of the starting silicon layer 11, which region is formed by a lamp thus fed with the excess input and lit, to sweep the whole part of the silicon layer 11. This embodiment can bring about the same effect as the former embodiment in which the wafer W is moved, thereby converting the starting silicon layer 11 into a single crystal silicon layer.

Figure 5:
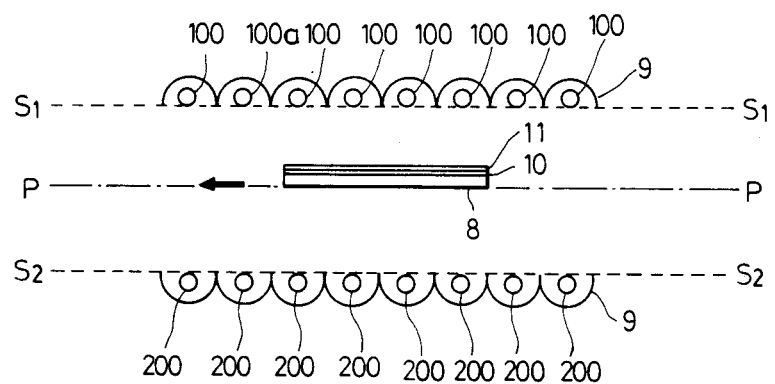
FIG. 5 is a schematic and fragmentary illustration of one example of a heat source useful in the practice of the third embodiment of this invention.

In the third embodiment of this invention, a plurality of tubular lamps 200 is provided in parallel with one another not only in the second plane $S_1$ but also in the third plane $S_2$ which lies below the first plane P and in parallel with the same first plane P, in the same manner as the plurality of tubular lamps in the second plane $S_1$. As shown in FIG. 5, a reflector plate 9 covers below the tubular lamps 200. Using the thus constructed heat source, the tubular lamps 200 are lit similar to the tubular lamps 100 so as to maintain the starting silicon layer 11 of the wafer W at 1100°–1400° C. for at least 4 seconds. Thereafter, similar to the first embodiment, the tubular lamp 100a in the second plane $S_1$ is fed and lit with an excess input greater than input for other lamps in the second plane $S_1$. At the same time, the wafer W is moved so as to form narrow molten zones from one side to the opposite side in the starting silicon layer 11 so as to convert the starting silicon layer 11 of the wafer W into a single crystal silicon layer.

In the fourth embodiment of this invention, a heat source similar to that used in the third embodiment is used. In order to form narrow molten region successively from one side to the opposite side in the starting silicon layer, the tubular lamps 100 arranged in the second plane $S_1$ are fed with an excess input and lit successively, one after another and in the order as they are arranged similar to the second embodiment without moving the wafer W relative to the tubular lamps 100, etc. The starting silicon layer 11 of the wafer W is thus converted into a single crystal silicon layer in the same manner as the third embodiment except the above-described successive lighting of the tubular lamps 100.

The fifth embodiment of this invention makes use of a heat source having the same structure as used in the third embodiment of this invention. The starting silicon layer 11 of the wafer W is maintained at 1100°–1400° C. for at least 4 seconds by lighting only the tubular lamps 200 arranged in the third plane $S_2$. Thereafter, a specific tubular lamp 100a in the second plane $S_1$ is lit and, at the same time, the wafer W is moved, thereby forming narrow molten regions successively from one side to the opposite side in the starting silicon layer 11 and thus converting the starting silicon layer 11 of the wafer W into a single crystal silicon layer.

In the sixth embodiment of this invention, the same heat source as that used in the third embodiment is used. In order to form narrow molten regions successively from one side to the opposite side in the starting silicon layer 11, the tubular lamps 100 arranged in the second plane $S_1$ are lit successively one after another in the order as they are arranged, without moving the wafer W relative to the tubular lamps 100, etc. while the same procedure with the lamps 200 in the plane $S_2$ of the fifth embodiment of this invention is practiced in the same manner to convert the starting silicon layer 11 of the wafer W into a single crystal silicon layer.

Preferred single crystal silicon layers may be advantageously formed by any of the above-described 2nd to 6th embodiments of this invention, similar to the first embodiment of this invention.

In the process according to this invention, there are used, as an element of a heat source, tubular lamps whose radiant light varies instantaneously in accordance with any changeover from one operation mode to another, for example, turning-on operation, turning-off operation, lighting operation with rated power or lighting operation with an excess input. Accordingly, the present invention is extremely advantageous in that use of such lamps permits easy control of the heating temperature, facilitates their maintenance or their replacement even if the lamps are deteriorated, and can avoid contamination of wafers. Although halogen incandescent lamps were used in the above embodiment, similar effects can be brought about from the use of discharge lamps such as xenon long-arc lamps as an element of a heat source.

Having now fully described the invention, it will be apparent to one of ordinary skill in the art that many changes and modifications can be made thereto without departing from the spirit or scope of the invention as set forth herein.

What is claimed is:

1. A process for forming a single crystal silicon layer by heating a wafer, which is made of a single crystal silicon substrate and a starting silicon layer made of amorphous or polycrystalline silicon and provided on the silicon substrate, in accordance with the epitaxial growth technique, which process comprises the following steps:

providing a heat source which comprises a plurality of tubular lamps provided side by side with their longitudinal axes extending substantially in parallel with one another in a second plane lying above and substantially in parallel with a first plane in which the wafer is placed;

lighting the tubular lamps of the heat source to radiate their light to the wafer so that the wafer is heated and the temperature of the starting silicon layer is maintained at 1100°–1400° C. for 4 seconds or longer; and then, radiating light from a specific lamp which is one of the tubular lamps and is lit with an excess input greater than the remaining lamps to a portion of the starting silicon layer of the wafer so as to raise the temperature of the portion of the starting silicon layer to 1410°–1480° C. and to form a narrow molten region, and moving the wafer in the first plane, in a direction perpendicular to the longitudinal axes of the tubular lamps and at a speed of at least 0.1 cm/sec. relative to the tubular lamps so as to form the same narrow molten regions as the former narrow molten region successively one after another in the wafer, thereby converting the starting silicon layer into the single crystal silicon layer.

2. A process for forming a single crystal silicon layer by heating a wafer, which is made of a single crystal silicon substrate and a starting silicon layer made of amorphous or polycrystalline silicon and provided on the silicon substrate, in accordance with the epitaxial growth technique, which process comprises the following steps:

providing a heat source which comprises a plurality of tubular lamps provided side by side with their longitudinal axes substantially in parallel with one another, respectively, in a second plane and third plane lying respectively above and below and substantially in parallel with a first plane in which the wafer is placed;

lighting the plurality of tubular lamps in both second and third planes simultaneously to radiate their light to the wafer so that the wafer is heated and the temperature of the starting silicon layer is maintained at 1100°–1400° C. for 4 seconds longer; and then, radiating light from a specific lamp which is one of the tubular lamps in the second plane and is lit with an excess input greater than the remaining lamps in the second plane to a portion of the starting silicon layer of the wafer so as to raise the temperature of the portion of the starting silicon layer to 1410°–1480° C. and to form a narrow molten region, and moving the wafer in the first plane, in a direction perpendicular to the longitudinal axes of the tubular lamps and at a speed of at least 0.1 cm/sec. relative to the tubular lamps so as to form the same narrow molten regions as the former narrow molten region successively one after another in the wafer, thereby converting the starting silicon layer into the single crystal silicon layer.

3. The process as claimed in claim 1, wherein the substrate of the wafer has on the upper surface thereof an insulative layer defining a groove therethrough, and the starting silicon layer is formed on the substrate with the insulative layer interposed therebetween, and the starting silicon layer is kept in direct contact with the substrate via the groove of the insulative layer.

4. The process as claimed in claim 3, wherein the insulative layer is made of silicon oxide or silicon nitride.

5. The process as claimed in claim 2, wherein the substrate of the wafer has on the upper surface thereof an insulative layer defining a groove therethrough, and the starting silicon layer is formed on the substrate with the insulative layer interposed therebetween, and the starting silicon layer is kept in direct contact with the substrate via the groove of the insulative layer.

6. The process as claimed in claim 5, wherein the insulative layer is made of silicon oxide or silicon nitride.

7. A process for forming a single crystal silicon layer by heating a wafer, which is made of a single crystal silicon substrate and a starting silicon layer made of amorphous or polycrystalline silicon and provided on the silicon substrate, in accordance with the epitaxial growth technique, wherein the process comprises the following steps:

providing a heat source which comprises a plurality of tubular lamps provided side by side with their longitudinal axes substantially in parallel with one another, respectively, in a second plane and third plane laying respectively above and below and substantially in parallel with a first plane in which the wafer is placed;

lighting the tubular lamps in the third plane to radiate their light to the wafer so that the wafer is heated and the temperature of the starting silicon layer is maintained at 1100°–1400° C. for 4 seconds or longer; and then, radiating light from a specific lamp which is one of the tubular lamps in the second plane to a portion of the starting silicon layer of the wafer so as to raise the temperature of the portion of the starting silicon layer to 1410°–1480° C. and to form a narrow molten region and moving the wafer in the first plane, in a direction perpendicular to the longitudinal axes of the tubular lamps and at a speed of at least 0.1 cm/sec. relative to the tubular lamps so as to form the same narrow molten regions as the former narrow molten region successively one after another in the wafer, thereby converting the starting silicon layer into the single crystal silicon layer.

8. The process as claimed in claim 7, wherein the substrate of the wafer has on the upper surface thereof an insulative layer defining a groove therethrough, and the starting silicon layer is formed on the substrate with the insulative layer interposed therebetween, and the starting silicon layer is kept in direct contact with the substrate via the groove of the insulative layer.

9. The process as claimed in claim 8, wherein the insulative layer is made of silicon oxide or silicon nitride.

* * * * *